(12) United States Patent
Wang et al.

(10) Patent No.: US 10,971,900 B2
(45) Date of Patent: Apr. 6, 2021

(54) VERTICAL-CAVITY SURFACE-EMITTING LASER, STRUCTURED LIGHT MODULE AND METHOD FOR LIGHT PROJECTION AND TERMINAL

(71) Applicant: SHENZHEN GOODIX TECHNOLOGY CO., LTD., Guangdong (CN)

(72) Inventors: Hao-Jen Wang, Guangdong (CN); Chung-Te Li, Guangdong (CN); Yung-Lin Huang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/408,334

(22) Filed: May 9, 2019

(65) Prior Publication Data

US 2020/0153206 A1    May 14, 2020

Related U.S. Application Data

(63) Continuation of application No. PCT/CN2018/114469, filed on Nov. 8, 2018.

(51) Int. Cl.
*H01S 5/42* (2006.01)
*H01S 5/00* (2006.01)
(Continued)

(52) U.S. Cl.
CPC .......... *H01S 5/423* (2013.01); *G02B 27/1086* (2013.01); *G02B 27/4205* (2013.01); *H01S 5/005* (2013.01); *H01S 5/18308* (2013.01)

(58) Field of Classification Search
CPC ............ G02B 27/1086; G02B 27/1093; G02B 27/4205; H01S 5/005; H01S 5/423
See application file for complete search history.

(56) References Cited

U.S. PATENT DOCUMENTS 8,749,796 B2    6/2014  Pesach et al.
9,052,512 B2 *  6/2015  Miyasaka .......... G02B 27/4266
(Continued)

FOREIGN PATENT DOCUMENTS

CN    106997603 A    8/2017
CN    206807664 U    12/2017
(Continued)

OTHER PUBLICATIONS

English Abstract Translation of Foreign Patent Document CN106997603A.
(Continued)

*Primary Examiner* — Michael Carter
(74) *Attorney, Agent, or Firm* — WPAT, P.C., Intellectual Property Attorneys; Anthony King

(57) ABSTRACT

The present disclosure provides a vertical-cavity surface-emitting laser, structured light module, terminal comprising the structured light module, and method for projecting the structured light thereof. The structured light module includes a plurality of light sources and a single diffractive optical element (DOE); wherein the plurality of light sources simultaneously emit a plurality beams of invisible light to the single DOE, wherein the single DOE has a pseudo-random optical pattern groove, wherein the invisible light of each light source passes through the DOE and emits a beam of spectral encoded structured light, and the beam of structured light comprises a pattern corresponding to the pseudo-random optical pattern groove. The DOE projects an overall structured light that is formed by superimposing a plurality of beams of structured light, and there is an offset between patterns of different beams of structured light.

13 Claims, 6 Drawing Sheets

(51) Int. Cl.
*G02B 27/42* (2006.01)
*G02B 27/10* (2006.01)
*H01S 5/183* (2006.01)

(56) References Cited

U.S. PATENT DOCUMENTS

| | | | |
|---|---|---|---|
| 9,606,237 B2 | 3/2017 | Herschbach et al. | |
| 10,054,430 B2* | 8/2018 | Mor | G06F 3/0304 |
| 10,462,451 B1* | 10/2019 | Trail | H04N 13/271 |
| 2012/0293625 A1* | 11/2012 | Schneider | G01B 11/25 348/46 |
| 2013/0038881 A1* | 2/2013 | Pesach | G01B 11/25 356/610 |
| 2016/0004920 A1* | 1/2016 | Armstrong-Crews | G03B 35/00 348/46 |
| 2016/0178915 A1 | 6/2016 | Mor et al. | |
| 2018/0045503 A1 | 2/2018 | Braker et al. | |

FOREIGN PATENT DOCUMENTS

| | | |
|---|---|---|
| CN | 107690565 A | 2/2018 |
| CN | 108107662 A | 6/2018 |
| CN | 108363267 A | 8/2018 |
| CN | 108594454 A | 9/2018 |
| CN | 108702218 A | 10/2018 |
| CN | 108710215 A | 10/2018 |
| WO | WO2011072864 A1 | 6/2011 |

OTHER PUBLICATIONS

English abstract translation of CN107690565A.
English abstract translation of CN108702218A.
English abstract translation of CN108710215A.
English abstract translation of CN206807664U.
English abstract translation of CN108107662A.
English abstract translation of CN108363267A.
English abstract translation of CN108594454A.

* cited by examiner

US 10,971,900 B2

VERTICAL-CAVITY SURFACE-EMITTING LASER, STRUCTURED LIGHT MODULE AND METHOD FOR LIGHT PROJECTION AND TERMINAL

CROSS REFERENCE TO RELATED APPLICATIONS

The present application is a continuation of international application No. PCT/CN2018/114469, filed on Nov. 8, 2018, of which is incorporated herein by reference in its entirety.

TECHNICAL FIELD

The present disclosure relates to structured light modules and, more particularly, to vertical-cavity surface-emitting lasers capable of projecting complex patterns, structured light modules, terminals comprising the structured light modules, and methods for projecting structured light.

BACKGROUND

Generally, when applying structured light modules in the 3D depth estimation, the higher the complexity and density of the generated structured light, the better the accuracy of the 3D depth estimation. Generally, the higher the density of the pattern on the diffractive optical element (DOE), the higher the density of the generated structured light. For example, on a DOE of the same size, the number of patterns increases from ten thousand to one hundred thousand; however, since the power of the light source in the structured light module has a certain upper limit, simply increasing the number of patterns on the DOE may result in a decrease of the energy appropriated to each pattern, thereby jeopardizing the accuracy of the 3D depth estimation. Accordingly, there is a need for further improvement and innovation.

SUMMARY OF THE INVENTION

One purpose of the present invention is to provide structured light modules, structured light sense modules, and methods for projecting structured light, to address the above-mentioned issues.

One embodiment of the present invention discloses a structured light module. The structured light module comprises a plurality of light sources and a single DOE; wherein the plurality of light sources simultaneously emit a plurality beams of invisible light to the single DOE, wherein the single DOE has a pseudo-random optical pattern groove, wherein the invisible light of each light source passes through the DOE and emits a beam of spectral encoded structured light, and the beam of structured light comprises a pattern corresponding to the pseudo-random optical pattern groove, wherein the DOE projects an overall structured light that is formed by superimposing a plurality of beams of structured light, and there is an offset between patterns of different beams of structured light.

The structured light module disclosed in the present invention employs a plurality of light sources that simultaneously emit a plurality beams of invisible light, and a single DOE that spectrally encodes the plurality beams of invisible light, projects a plurality beams of structured light and superimposes these beams of structured light. Since there is an offset between the patterns of different beams of structured light, the superimposed structured light will, of course, have a pattern with a higher density, thereby increasing the complexity of the pattern features effectively.

One embodiment of the present invention discloses a terminal. The terminal comprises the above-mentioned structured light module and an optical sensing device; wherein the optical sensing device senses the reflected overall structured light.

The terminal disclosed in the present invention employs the structured light module that projects the overall structured light formed by superimposing a plurality beams of structured light; and since the overall structured light formed by superimposing a plurality beams of structured light has a pattern with a higher density, when the optical sensing device senses the reflected overall structured light, it is feasible to estimate the 3D depth more accurately using the complex pattern features.

One embodiment of the present invention discloses a method for projecting structured light. The method for projecting structured light comprises steps of: (a) driving a plurality of light sources to simultaneously emit a plurality beams of invisible light to a single diffractive optical element (DOE), wherein the DOE has a pseudo-random optical pattern groove; and (b) controlling the single DOE to project an overall structured light formed by superimposing a plurality beams of structured light, wherein each of the plurality beams of the superimposed structured light comprises a pattern corresponding to the pseudo-random optical pattern groove, and there is an offset between the patterns of different beams of structured light.

The method for projecting structured light disclosed in the present invention involves, primarily, simultaneously emitting a plurality beams of invisible light to a single DOE, and after spectrally encoding the plurality beams of invisible light using the single DOE, projecting and superimposing a plurality beams of structured light. Since there is an offset between the patterns of different beams of structured light, the overall structured light formed by superimposing the plurality beams of structured light will, of course, have a pattern with a higher density, thereby increasing the complexity of the pattern features effectively.

One embodiment of the present invention discloses a light sources module for use in a structured light module, wherein the light sources module comprises: a first light source, configured to emit a first invisible light; and a second light source, configured to emit a second invisible light; wherein the intensities of first invisible light and the second invisible light are greater than 0 and different from each other.

DETAILED DESCRIPTION

Some terms may be used throughout the present specification and the appended claims to refer to a specific element or. As could be appreciated by persons having ordinary skill in the art, the manufacturers may use a different name to refer to the same element. Therefore, the differences in names shall not be used as a means to distinguish the elements throughout the; rather, the elements shall be distinguished with the differences in function. As used herein and in appended claims, the term "comprise" shall be construed as an open transitional phrase, and it shall mean "including, but not limited to."

The present structured light module and method for projecting structured light disclosed herein can project structured light with a high pattern complexity; further, the terminal disclosed in the present invention employs the structured light module and method for projecting structured light projects, so that by sensing structured light with a high pattern complexity, it is feasible to improve the accuracy of 3D depth estimation. The technical content of the structured light module, structured light sense module, and methods for projecting structured light according to the present invention is discussed in detailed below in connection with a plurality of embodiments and drawings.

Figure 1:
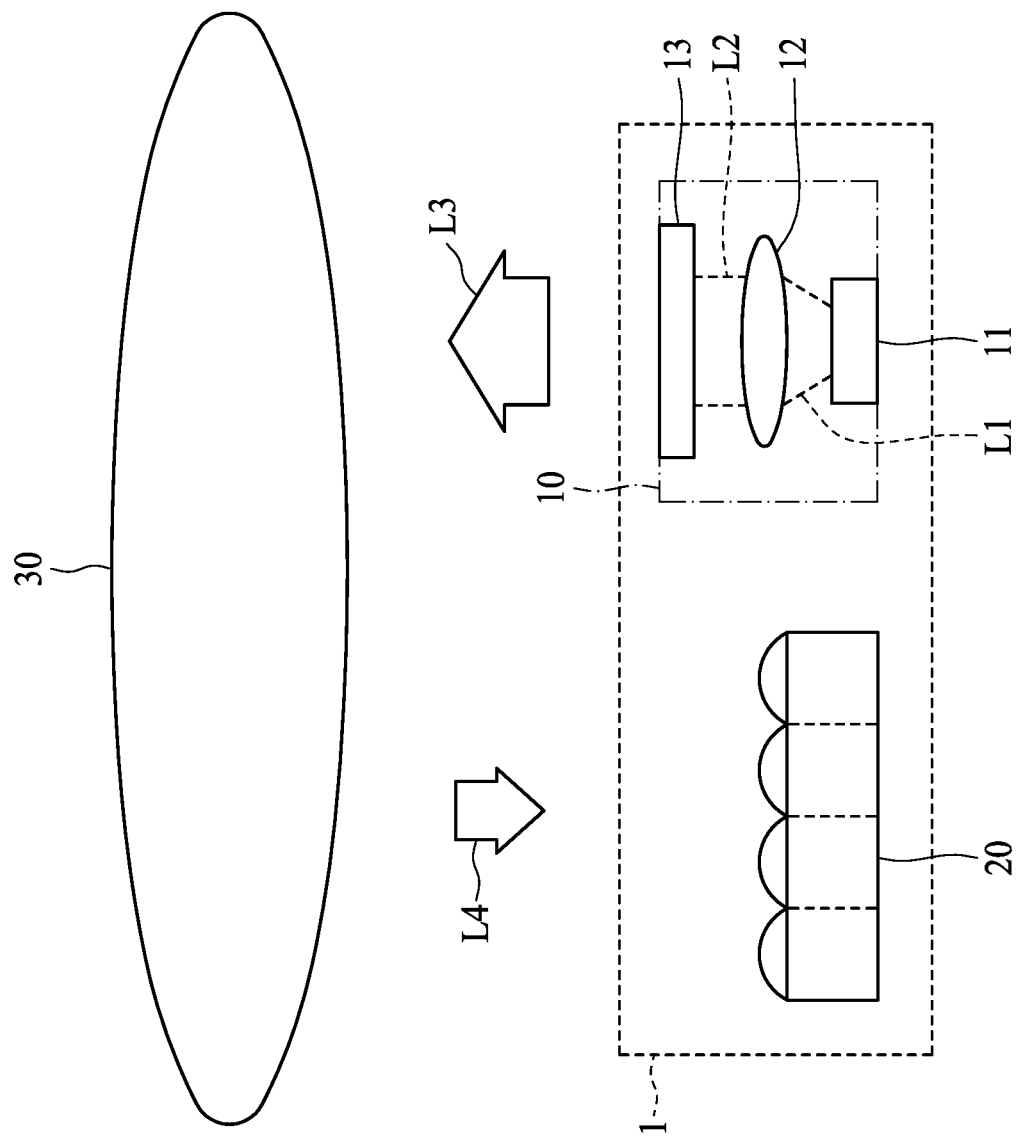
FIG. 1 is a schematic diagram illustrating the structure of a structured light sense module according to one embodiment of the present invention.
Figure 3:
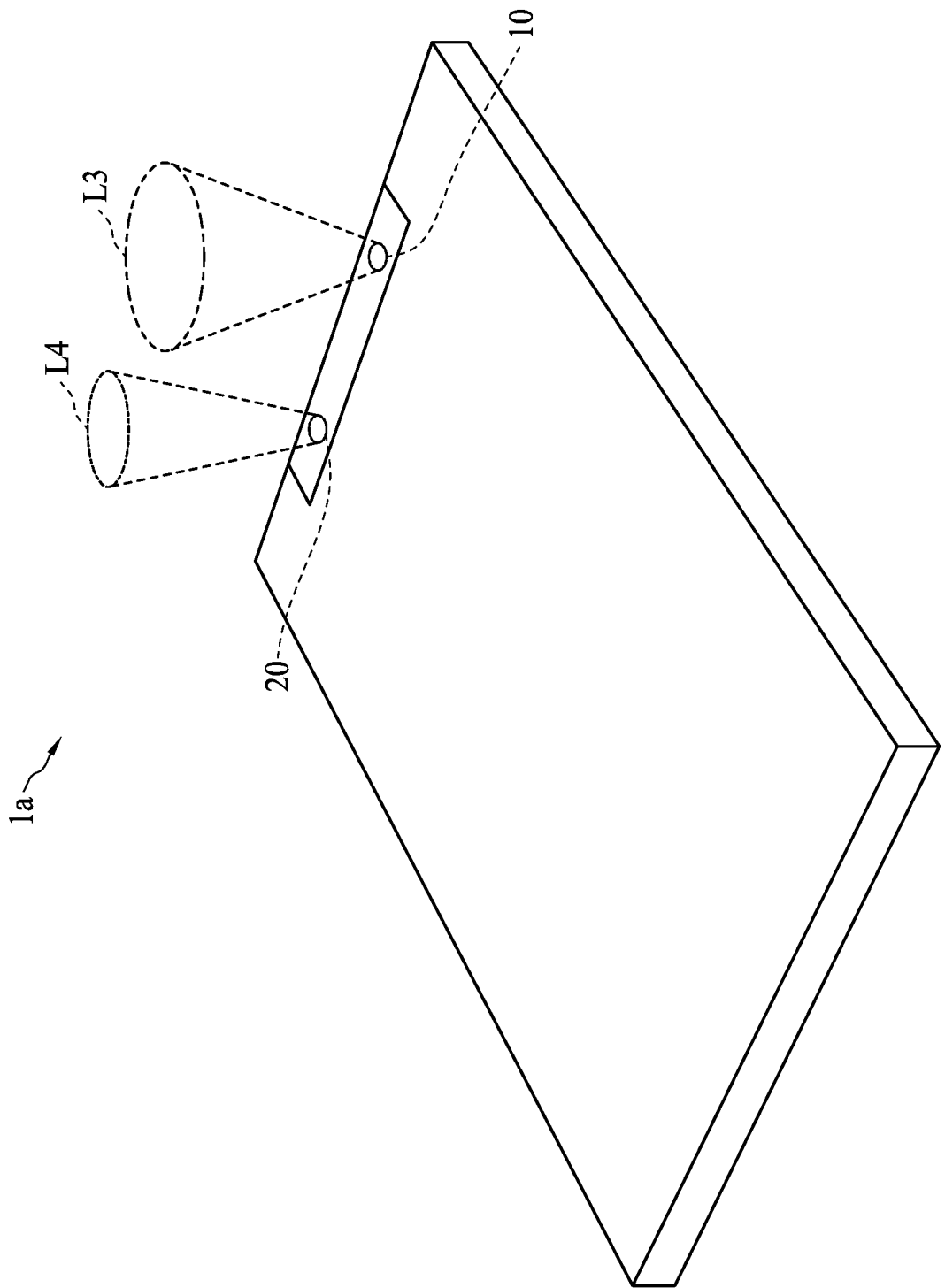
FIG. 3 is a schematic diagram illustrating the structure of the present terminal.

Reference is made to FIG. 1, which is a schematic diagram illustrating a structured light sense module 1 according to one embodiment of the present invention, and the structured light sense module 1 comprises a structured light module 10 according to the present invention and an optical sensing device 20. The structured light module 10 projects an overall structured light L3, which has a pattern with a high complexity, that is, a highly complex pattern feature. The optical sensing device 20 is configured to sense an overall structured light L4 reflected by an object 30. Referring also to FIG. 3, the structured light module 10 and optical sensing device 20 of the structured light sense module 1 according to the present invention may be further applied in a terminal 1a. Specifically, the terminal 1a may be any electronic apparatus with computing and control functions, such as, computers, access control systems, or any portable devices, such as mobile phones, cameras, etc.

Figure 2B:
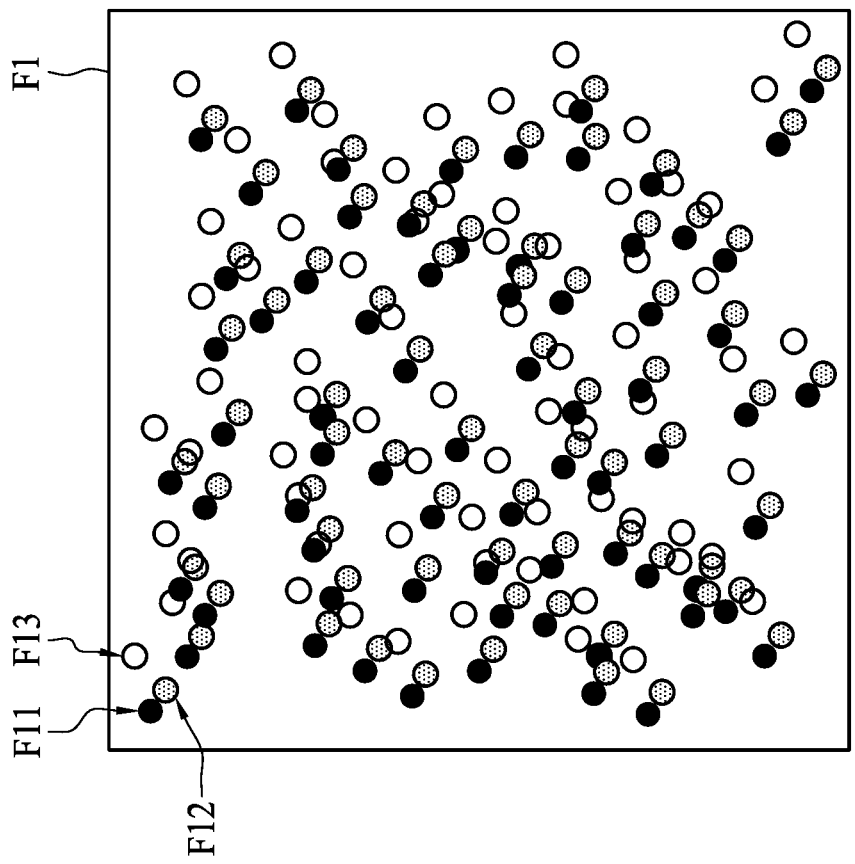
FIG. 2B is a schematic diagram illustrating the pattern of an overall structured light projected by the structured light module shown in FIG. 2A.
Figure 2A:
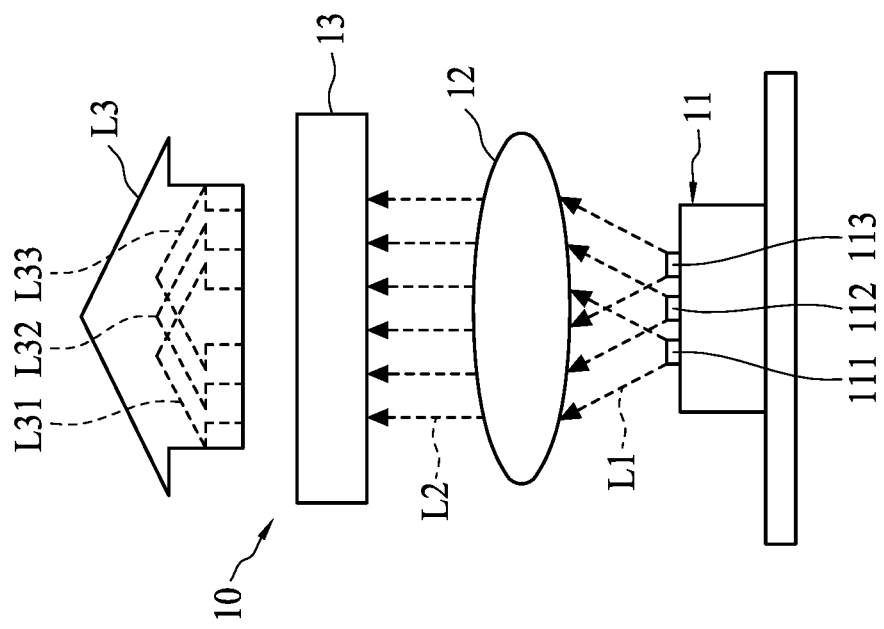
FIG. 2A is a schematic diagram illustrating a pseudo-random optical groove of the present structured light module.

Reference is made to FIG. 2A, in one embodiment, the structured light module 10 comprises a vertical-cavity surface-emitting laser (VCSEL) 11, a collimating lens 12 and a single DOE 13; wherein the vertical-cavity surface-emitting laser 11 comprises a plurality of light sources 111, 112, 113, and the collimating lens 12 is disposed between the plurality of light sources 111, 112, 113 of the vertical-cavity surface-emitting laser 11 and the single DOE. Preferably, the plurality of light sources 111, 112, 113 are arranged in a matrix. Preferably, the plurality of light sources are arranged in an n-by-n matrix, wherein n is an integer greater than 1; further, the plurality of light sources may also be arranged pseudo-randomly. It should be noted that although only three light sources 111, 112, 113, are illustrated in the drawings, persons having ordinary skill in the art may understand that the number of light sources is, of course, not limited to the number (3*3) illustrated in the drawings.

When the plurality of light sources 111, 112, 113 are driven to simultaneously emit a plurality beams of invisible light L1 to the collimating lens 12; in the present embodiment, said invisible light L2 are, for example, the near infrared (wavelength ranging from 800 nm to 2500 nm) or infrared laser; preferably, the wavelength of the invisible light is single wavelength.

When the plurality of light sources 111, 112, 113 emits the invisible light L1 to the collimating lens 12, the collimating lens 12 shapes the plurality beams of invisible light L1 into a collimated light L2, and emits the collimated light L2 to the single DOE 13. Of course, the collimating lens 12 may be disposed outside the structured light module.

Figure 2C:
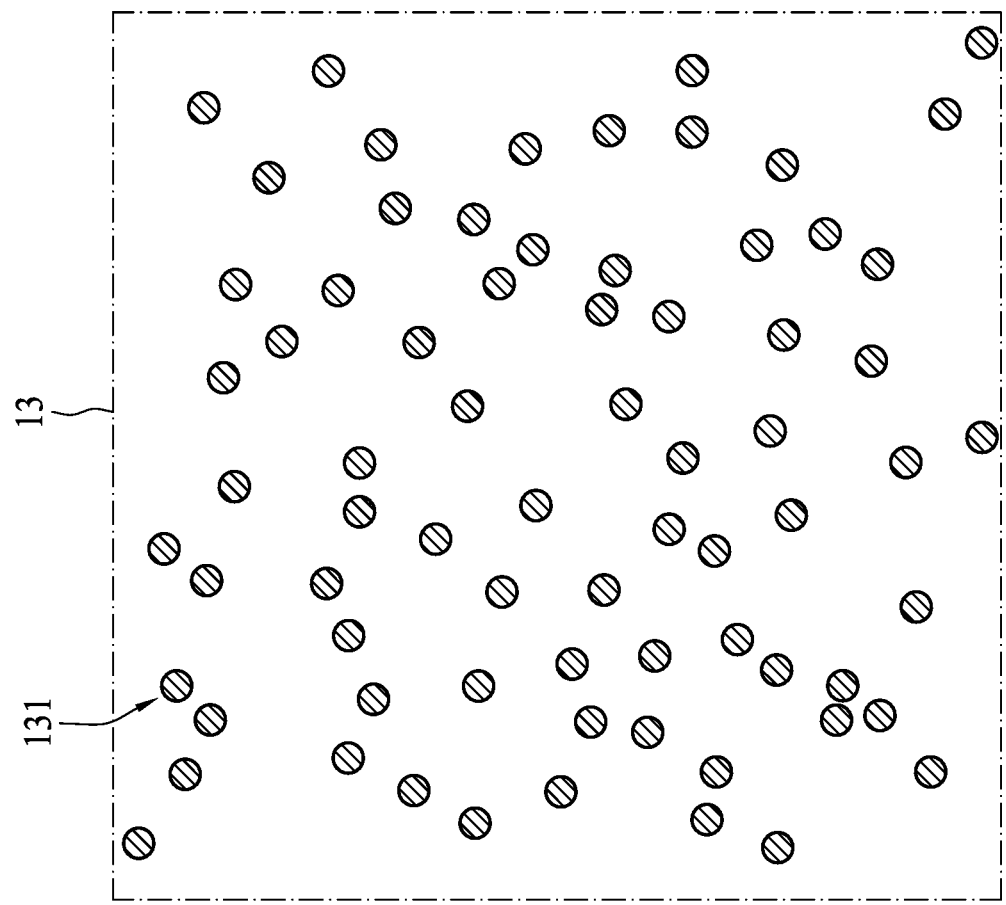
FIG. 2C is a schematic diagram illustrating the structure of an optical groove of the present DOE.

The single DOE 13 comprises a pseudo-random optical pattern groove 131, as shown in FIG. 2C; after the invisible light L1 of each light source 111, 112, 113 passes through the DOE 12, spectrally encoded structured lights L31, L32, L33 are emitted; further, as shown in FIG. 2B, each beam of structured lights L31, L32, L33 comprises a pattern F11, F12, F13 respectively corresponding to the pseudo-random optical pattern groove. Accordingly, the overall structured light L3 projected by the DOE 10 is formed by superimposing the plurality beams of structured light L31, L32, L33; since there is an offset between the patterns F11, F12, F13 of different beams of structured light L31, L32, L33, the complexity of the pattern F1 of the overall structured light L3 is increased accordingly; that is, as compared with a single beam of structured light, it comprises more and denser patterns, thereby effectively increasing the complexity of the pattern features.

Referring back to FIG. 1, after the structured light module 10 projects the overall structured light L3 to an object 30, the light is reflected by the object 30 to the optical sensing device 20; next, the optical sensing device 20 senses the reflected overall structured light L4, so that the 3D depth of the object 30 (that is, the imaging target or the measurement target) may be estimated based on the complex pattern features.

Figure 4:
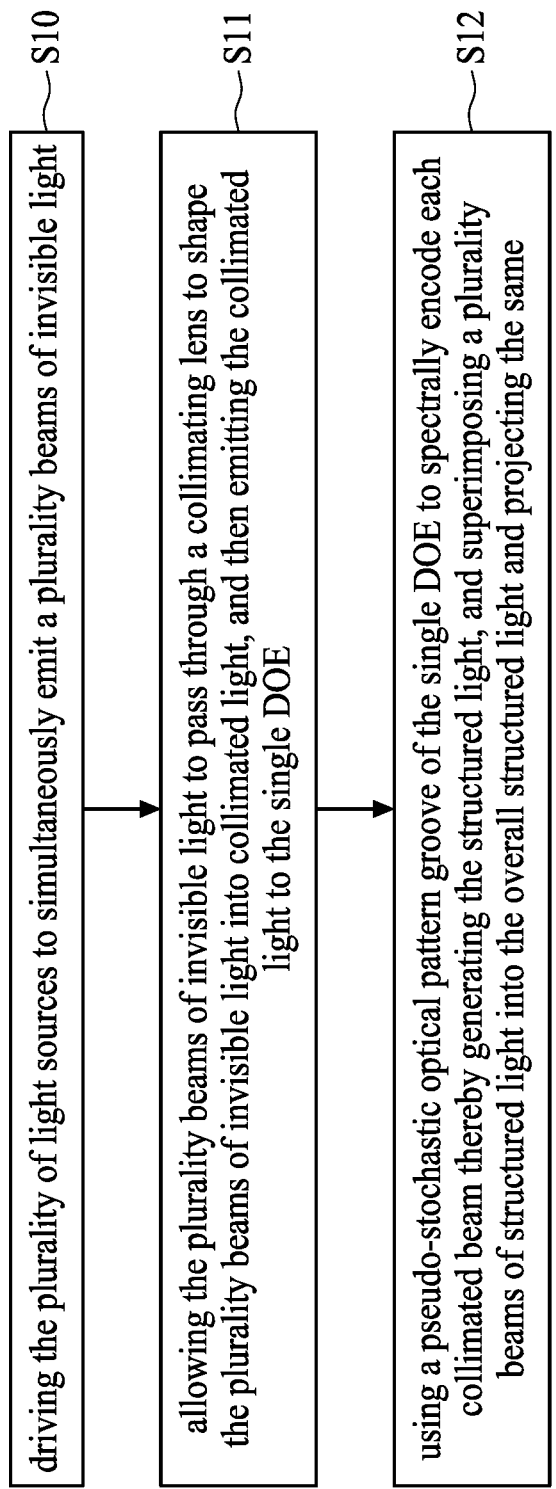
FIG. 4 is a flowchart illustrating the method for projecting structured light according to the present invention.

Reference is made to FIG. 4, in view of the foregoing, the method for projecting structured light according to the present invention comprises steps as follows. First, the plurality of light sources are driven to simultaneously emit a plurality beams of invisible light (S10), the plurality beams of invisible light pass through a collimating lens and are shaped by the same into a collimated light, which is them emitted to the single DOE (S11); then a pseudo-random optical pattern groove of the single DOE is used to spectrally encode each collimated light thereby generating the structured light, and superimposing a plurality beams of structured light into the overall structured light and projecting the same (S12); each of the plurality beams of the superimposed structured light respectively comprises a pattern corresponding to the pseudo-random optical pattern groove, and there is an offset between the patterns of different beams of structured light. Accordingly, the overall structured light projected by the method for projecting structured light according to the present invention indeed has pattern features of high complexity.

Moreover, to make the pattern features of the overall structured light more complex, in another embodiment, the light sources are driven to emit invisible light with different intensities, so that in the intensities of the plurality of patterns in the overall structured light are no longer uniform; accordingly, in addition to the shapes of the patterns, the overall structured light comprises an additional feature of the pattern, thereby increasing the complexity of the pattern features. Preferably, the plurality beams of invisible light emitted by the plurality of light sources comprises at least two different intensities that are greater than 0. In fact, under the idea energy power condition and without considering the brightness saturation, if the intensity of a light source is doubled, the intensity of the brightness of its pattern is also doubled.

Therefore, according to the present invention, the plurality of light sources emitting light pf different intensities may be disposed alternately, so that the projected patterns form an image with a plurality of bright points during the intersecting and superimposing process, wherein the patterns projected by different light sources may overlap partially.

Figure 2D:
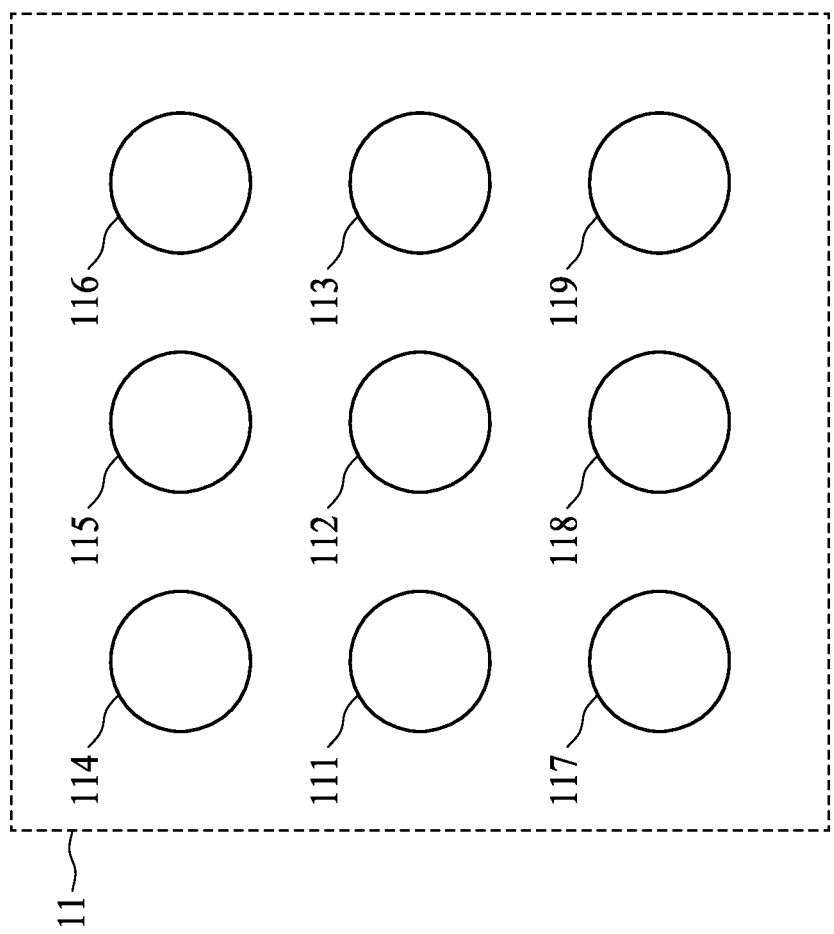
FIG. 2D is a schematic diagram illustrating a vertical-cavity surface-emitting laser according to one embodiment of the present invention.

Reference is made to FIG. 2D, which is a schematic diagram illustrating the vertical-cavity surface-emitting laser 11 according to one embodiment of the present disclosure. As shown in FIG. 2D, the vertical-cavity surface-emitting laser 11 comprises nine light sources 111 to 119 that are arranged in a 3-by-3 matrix; in one embodiment, the light sources 111, 113, 115 and 118 can emit invisible light having a first unit intensity, whereas the light sources 112, 114, 116, 117 and 119 cane emit invisible light having a second unit intensity. In this embodiment, the first unit intensity differs from the second unit intensity; for example, the second unit intensity is three time as much as the first unit intensity; that is, the ratio of the brightness level of the second unit intensity to the brightness level of the first unit intensity equals 3:1. Accordingly, when a first unit area of the object 30 is illuminated by the structured light emitted by one of the light sources, the brightness level of the first unit area is either 1 or 3; when a second unit area of the object 30 is illuminated by structured light emitted by two different light sources simultaneously, the brightness level of the second unit area may be 2 (i.e., 1+1), 4 (i.e., 1+3) or 6 (i.e., 3+3); when a third unit area of the object 30 is illuminated by structured light emitted by three different light sources simultaneously, the brightness level of the third unit area may be 3 (i.e., 1+1+1), 5 (i.e., 1+1+3), 7 (i.e., 3+3+1) or 9 (i.e., 3+3+3); when a fourth unit area of the object 30 is illuminated by structured light emitted by four different light sources simultaneously, the brightness level of the fourth unit area is 4 (i.e., 1+1+1+1), 6 (i.e., 1+1+1+3), 8 (i.e., 1+1+3+3), 10 (i.e., 1+3+3+3) or 12 (i.e., 3+3+3+3).

In another embodiment, the light sources 111, 113, 115 and 118 can emit invisible light having a first unit intensity; light sources 114, 116, 117 and 119 can emit invisible light having a second unit intensity; whereas the light source 112 can emit invisible light having a third unit intensity. In this embodiment, the first unit intensity, the second unit intensity and the third unit intensity are different from one another; for example, the second unit intensity may be twice as much as the first unit intensity, and the third unit intensity is triple as much as the first unit intensity.

Accordingly, the present invention can generate pattern features with a higher complexity by superimposing a plurality of light sources of different intensities; therefore, the complexity and local uniqueness of the thus-obtained pattern features are higher, thereby resulting in a better definition of the local features; therefore, it is advantageous because there is no need to increase the cost and the density of the optical pattern groove of the single DOE; also, there is no need to separately capture images that are generated after the target is illuminated by structured light emitted by different light sources projects.

In view of the foregoing, the structured light sense module disclosed in the present invention, by using a plurality of light sources to simultaneously emit a plurality beams of invisible light, and by using a single DOE to spectrally encode the plurality beams of invisible light, projects a plurality beams of structured light that are superimposed. Since there is an offset between the patterns of different beams of structured light, the overall structured light formed by superimposing the plurality beams of structured light has, of course, more and denser patterns, thereby effectively improving the complexity of the pattern features of the overall structured light; in this way, when the optical sensing device senses the reflected overall structured light, the complex pattern features can be used to estimate a more accurate 3D depth.

The foregoing outlines only some preferred embodiments the present invention, and shall not be construed to limited the present invention; those skilled in the art should appreciate that they may made various change or modification to the present invention. Any change, equivalent substitution and improvement made within the spirit and principle according to the present invention are comprised in the scope of the present disclosure.

What is claimed is:

1. A structured light module, comprising:
   a plurality of light sources, simultaneously emitting a plurality beams of invisible light, wherein the plurality of light sources are arranged pseudo-randomly; and
   a single diffractive optical element (DOE), disposed over the plurality of light sources, and having a pseudo-random optical pattern groove, wherein the invisible light of each light source passes through the DOE and emits a beam of spectral encoded structured light, and the beam of structured light comprises a pattern corresponding to the pseudo-random optical pattern groove; wherein the DOE projects an overall structured light formed by superimposing a plurality beams of structured light, and there is an offset between different beams of structured light.

2. The structured light module of claim 1, further comprising a collimating lens, wherein the collimating lens is disposed between the plurality of light sources and the DOE, and shapes the invisible light of the plurality of light sources into a collimated light and emits the same to the DOE.

3. The structured light module of claim 1, wherein the plurality beams of invisible light emitted by the plurality of light sources have different intensity.

4. The structured light module of claim 3, wherein the plurality beams of invisible light emitted by the plurality of light sources have at least two different intensities that are greater than 0.

5. The structured light module of claim 3, wherein the light sources of the plurality of light sources emitting beams of different intensity are arranged alternately.

6. The structured light module of claim 5, wherein the invisible light is near infrared.

7. The structured light module of claim 6, wherein wavelengths of the plurality beams of invisible light are substantially the same.

8. A method for projecting structured light, comprising:
   (a) driving a plurality of light sources to simultaneously emit a plurality beams of invisible light to a single diffractive optical element (DOE), wherein the plurality of light sources are arranged pseudo-randomly, and the DOE has a pseudo-random optical pattern groove; and
   (b) controlling the single DOE to project an overall structured light formed by superimposing a plurality beams of structured light, wherein each of the plurality beams of structured light comprises a pattern corresponding to the pseudo-random optical pattern groove, and there is an offset between the patterns of different beams of structured light.

9. The method for projecting structured light of claim 8, wherein in the step (a), the plurality beams of invisible light are shaped into a collimated light using a collimating lens and then emitted to the single DOE.

10. The method for projecting structured light of claim 8, wherein in the step (a), the intensities of the plurality beams of invisible light emitted by the plurality of light sources are different.

11. The method for projecting structured light of claim 10, wherein the plurality beams of invisible light emitted by the plurality of light sources have at least two different intensities that are greater than 0.

12. The method for projecting structured light of claim 10, wherein the light sources of the plurality of light sources emitting beams of different intensity are arranged alternately.

13. The method for projecting structured light of claim 12, wherein the invisible light is near infrared of a single wavelength.

\* \* \* \* \*